United States Patent [19]

Connell et al.

[11] Patent Number: 5,586,149
[45] Date of Patent: Dec. 17, 1996

[54] INTERFERENCE DEPENDENT ADAPTIVE PHASE CLOCK CONTROLLER

[75] Inventors: Lawrence E. Connell, Naperville; David D. Kang; Neal W. Hollenbeck, both of Schaumburg; William J. Roeckner, Algonquin, all of Ill.

[73] Assignee: Motorola Inc., Schaumburg, Ill.

[21] Appl. No.: 351,854

[22] Filed: Dec. 7, 1994

[51] Int. Cl.[6] .............................. H04B 1/10; H04L 25/08
[52] U.S. Cl. ........................................ 375/346; 375/371
[58] Field of Search .................... 375/216, 346, 375/349, 371; 364/139, 148, 180, 181

[56] References Cited

U.S. PATENT DOCUMENTS 4,746,899  5/1988  Swanson et al. .

Primary Examiner—Stephen Chin
Assistant Examiner—Don N. Vo
Attorney, Agent, or Firm—Nicholas C. Hopman

[57] ABSTRACT

An interference dependent adaptive phase clock controller method and system includes synthesis of a signal processing clock signal (307). An interference signal (311) dependent on a phase of the signal processing clock signal is measured, and a phase correction signal (317) is provided dependent thereon. A magnitude of the interference signal is reduced by adjusting the phase of the signal processing clock signal (307) dependent on the phase correction signal (317).

11 Claims, 4 Drawing Sheets

500

5,586,149

INTERFERENCE DEPENDENT ADAPTIVE PHASE CLOCK CONTROLLER

FIELD OF THE INVENTION

This invention is generally directed to the field of integrated circuits and particularly useful for improving signal fidelity in mixed-mode analog-digital signal processing circuits.

BACKGROUND OF THE INVENTION

In contemporary mixed analog-digital signal processing integrated circuits, electrical noise or interference generated by on-chip digital circuits reduces fidelity of analog signals being processed by on-board analog circuits. Circuit architectures for these analog circuits include analog sampled-data or switched-capacitor circuits. In a switched-capacitor circuit, an analog signal can be periodically coupled to a capacitor which is charged by the analog signal. While the analog signal is coupled to the capacitor, transitions of on-chip digital signals which include a signal controlling the aforementioned coupling action, can reduce the fidelity of the coupled analog signal because interference associated with the transitions of on-chip digital signals can be coupled into the analog signal.

In one case, the interference can take the form of power supply perturbations associated with transitions of various on-chip digital signals. This interference can manifest itself in the form of an offset error in the analog signal being processed.

In another case the interference can be somewhat random and associated with certain operations of the mixed-mode circuit hosting the analog circuit. For instance, if a logical operation—such as gating integrated output drivers is functioning while the analog signal is being processed electrical perturbations can infiltrate the analog signal, thereby reducing the analog signal's fidelity.

What is needed is an approach that may include a system and/or method for improving signal fidelity in mixed-mode analog-digital signal processing circuits that is usually degraded dependent on interference attributable to on-chip digital signals.

DETAILED DESCRIPTION OF A PREFERRED EMBODIMENT

An interference dependent adaptive phase clock controller method and system is described that improves a fidelity of an analog signal being processed, by adjusting a phase of a signal processing clock signal synthesized by the adaptive phase clock controller. The adjustment is made dependent on a measurement of an interference signal that is associated with the phase of the signal processing clock signal. The interference signal is measured in a control circuit which is largely the same as a circuit processing the analog signal. The phase of the signal processing clock signal is adjusted to minimize the interference.

An assumption is made that the measurement and reduction in the level of the interference signal in the control circuit will cause a corresponding reduction of interference in the circuit processing the analog signal. The interference, as mentioned in the Background, can manifest itself as a voltage offset in one application, or a random noise power level caused by other circuits on the same circuit as the circuit processing the analog signal.

In operation, the method/system includes synthesis of a signal processing clock signal. An interference signal is measured dependent on a phase of the signal processing clock signal, and a phase correction signal, or factor, is provided dependent thereon. Synthesis of the phase correction signal takes different forms dependent on the type of interference behavior being compensated for. A magnitude of the interference signal is reduced by adjusting the phase of the signal processing clock signal dependent on the phase correction signal. The preferred embodiment can be better understood by referring to the accompanying drawings.

Figure 1:
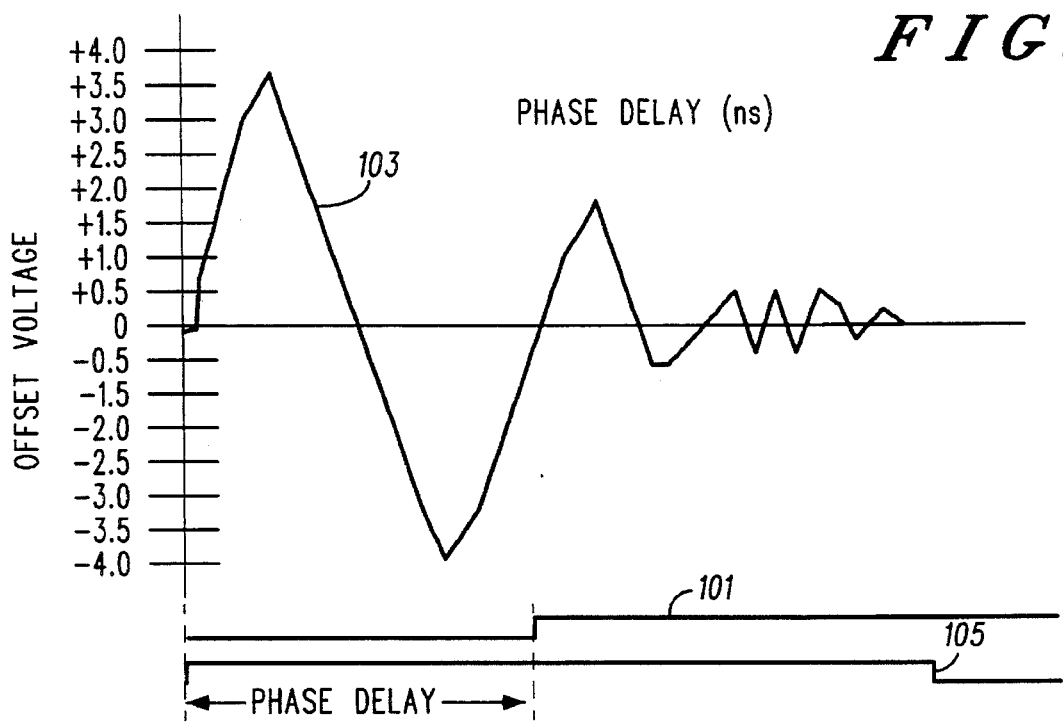
FIG. 1 is a graph of offset voltages of an analog signal dependent on a phase between a system clock signal and a signal processing clock signal.

FIG. 1 is a graph of offset voltages of an analog signal dependent on a phase between a system clock signal and a signal processing clock signal. Essentially, this graph represents one form of behavior of an interference signal that combines with and reduces fidelity of a processed analog signal. A signal 101 represents an example of the above-mentioned signal processing clock signal and a signal 105 represents an example of the above-mentioned system clock signal with a certain phase relationship to the signal processing clock signal 101. A magnitude of an interference signal 103 is dependent on the phase relationship between the signals 101 and 105. In one case the interference signal 103 manifests itself as an offset error that is added to an analog signal being processed. This diagram will be described more fully below.

Figure 2:
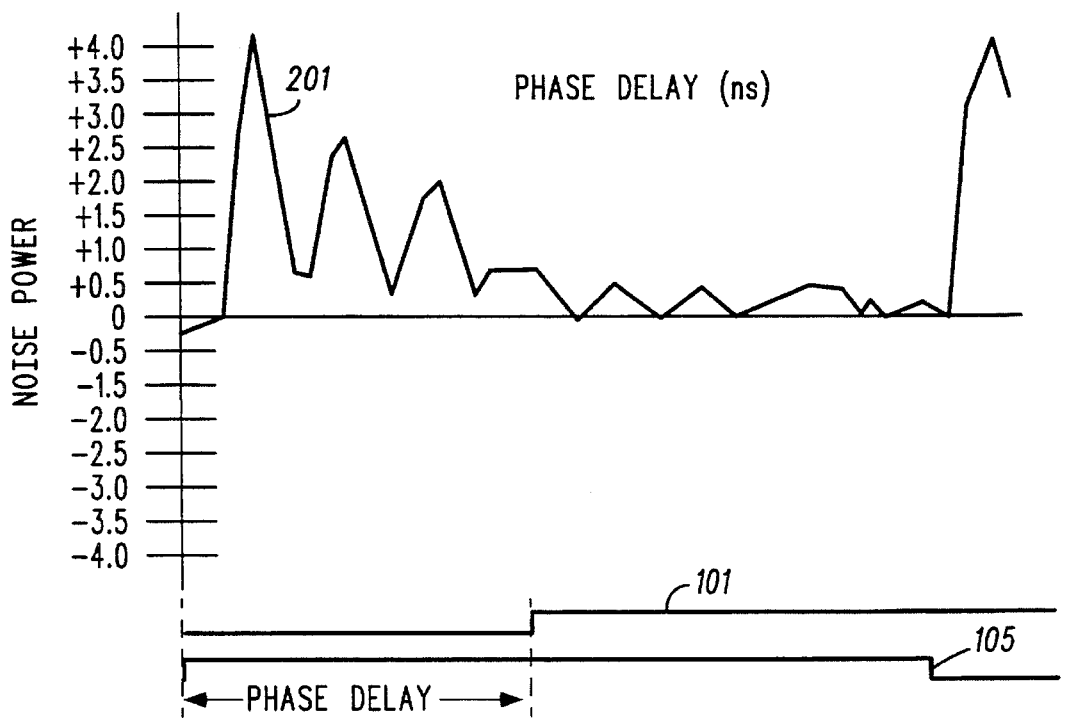
FIG. 2 is a graph of a noise power of an analog signal dependent on a phase between a system clock signal and a signal processing clock signal.

FIG. 2 is a graph of a noise power of an analog signal dependent on a phase between a system clock signal and a signal processing clock signal. This graph represents another form of behavior of an interference signal that combines with and reduces fidelity of the processed analog signal. Here, the signals 101 and 105 are repeated for reference purposes. Another interference signal 201 results from varying a phase of the signal processing clock signal 101. This interference signal 201 essentially manifests itself as a noise power signal that is added to an analog signal being processed. This diagram will also be described more fully below when more of the system is revealed.

Figure 3:
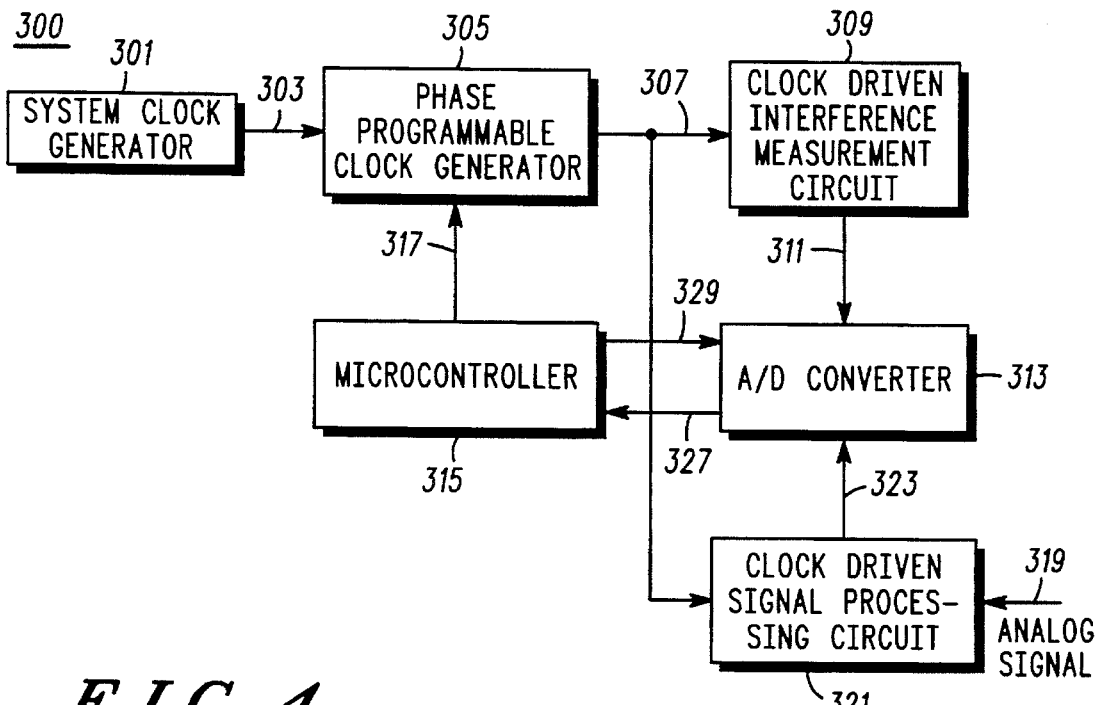
FIG. 3 is a block diagram illustrating a preferred system configuration.

FIG. 3 is a block diagram illustrating a preferred system configuration. A system clock generator 301 generates a system clock signal 303 that comprises discrete signal transitions. This system clock signal 303 operates a signal processing portion of a mixed-mode analog and digital signal processing integrated circuit and also a purely digital portion of the same integrated circuit. A phase programmable, signal processing, clock generator 305 uses the system clock signal 303 to synthesize a signal processing clock signal 307. The signal processing clock signal 307 is also synthesized dependent on a phase correction signal provided by execution of a preferred method described later. In the preferred embodiment a phase programmable clock generator can be constructed using a set of delay elements cascaded in series. A phase of the clock generator can be selected by switching in and out different members of the set of delay elements. An example set of delay elements includes 5 elements with a delay of 2 nanoseconds each and 12 elements with a delay of 10 nanoseconds each. Using these 17 element delays between 0 nanoseconds and 130 nanoseconds can be generated and used to derive the interference signal model and later to program the phase programmable clock generator 305.

A clock driven interference measurement circuit 309 is simply a signal processing circuit virtually identical to another signal processing circuit described below—but with the input terminated to a reference terminal such as circuit ground. This assures that the output of the circuit will only reflect the so-called interference signal. The clock driven interference measurement circuit 309 provides a measured interference signal 311 dependent on the phase of the signal processing clock signal 307.

An analog-to-digital converter (A/D converter) 313 acquires the measured interference signal 311 on a first input channel and transforms it into a form interpretable by a microcontroller 315. In the preferred embodiment a Motorola MC68HC11E9 microcontroller is used. The Motorola MC68HC11E9 microcontroller includes masked ROM for storing and executing a firmware program representative of the method later described in flow chart form in FIGS. 4–6. Those skilled in the art will recognize many other substantially equivalent hardware platforms for executing the preferred method. The microcontroller 315 accepts and processes data 327 from the A/D converter 313. A signal 329 is used to address a specific input signal channel of the A/D converter. So, the microcontroller 315 commands the A/D converter 313 using signal 329 to acquire the interference signal 311 from the first input and receives the corresponding data 327 in digital form.

A clock driven signal processing circuit 321 operates on an analog signal 319 commanded by the signal processing clock signal 307. The analog signal 319 may be produced by an external sensor or other external means. The analog signal 319 is processed by the clock driven signal processing circuit 321 which produces a processed analog signal 323. It is this processed analog signal 323 that has its fidelity degraded by the earlier-identified causes in ordinary mixed-mode signal processing approaches. When appropriate the microcontroller 315 commands the A/D converter 313 using signal 329 to acquire the processed analog signal 323 from a second input channel and receives the corresponding data 327 in digital form.

Dependent on the preferred method described later, a phase correction signal 317 is provided to the phase programmable clock generator 305 to maximize the fidelity of the processed analog signal 323. In the preferred embodiment the system clock generator 301, the phase programmable clock generator 305, the clock driven interference measurement circuit 309, the A/D converter 313, and the clock driven signal processing circuit 321 are all integrated onto a single integrated circuit substrate. Now that the preferred system configuration has been described the preferred method will be detailed next.

Figure 4:
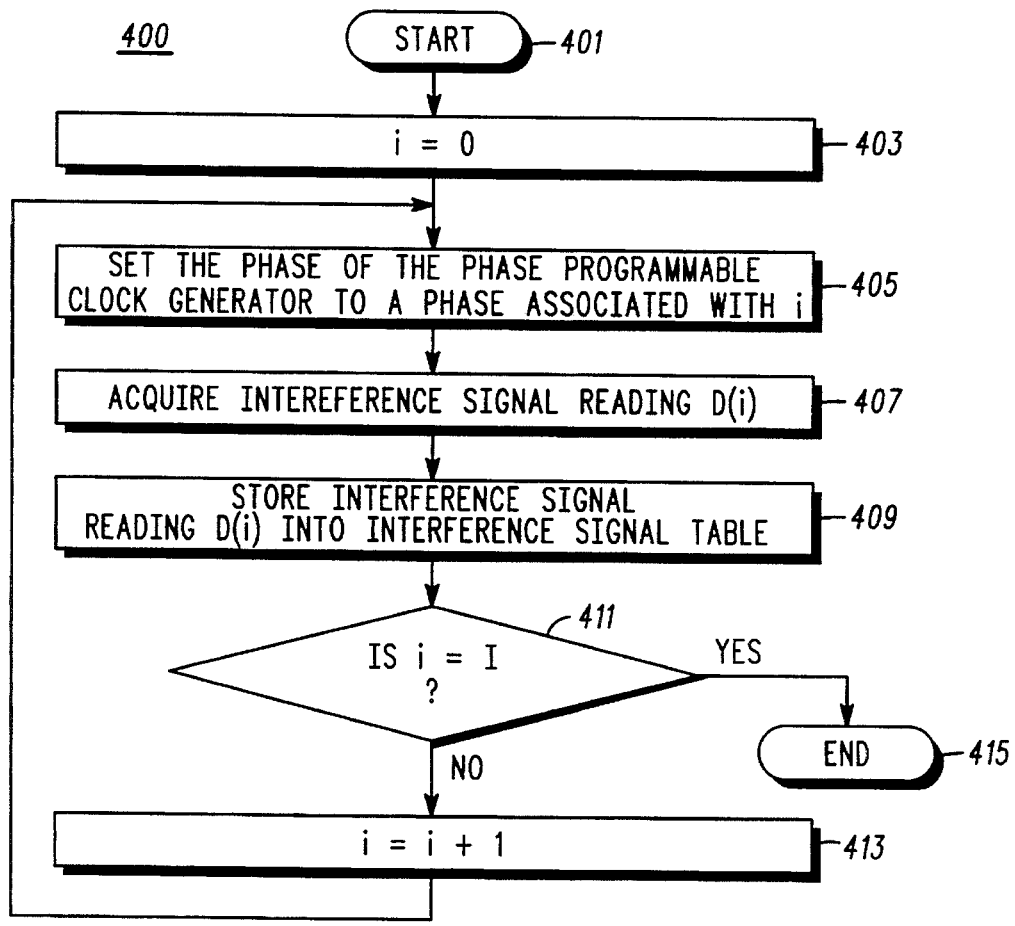
FIG. 4 is a flow chart illustrating method steps associated with the acquisition of an interference signal model in accordance with a preferred embodiment of the invention.

FIG. 4 is a flow chart illustrating method steps associated with the acquisition of an interference signal model, or characteristic curve, in accordance with the preferred embodiment of the invention. This flow chart is encoded in machine code to be executed on the Motorola MC68HC11E9 microcontroller described in FIG. 3. The routine 400 shown in FIG. 4 operates infrequently on the microcontroller 315 and can be thought of as a calibration sequence that is used to determine a relationship between the measured interference signal 311 and a phase of the signal processing clock signal 307 in comparison to either a phase of the system clock signal 303 or operations of a mixed-mode circuit that the system shown in FIG. 3 is a part of. In this example the phase of the signal processing clock signal 307 is varied in comparison to the phase of the system clock signal 303 and the interference signal takes the form of the offset signal shown in FIG. 1. The determination sequence includes iteratively adjusting the phase of the signal processing clock signal 307 while measuring the interference signal 311 and storing it in an interference signal model for use later. The interference signal model is later parsed to find a most stable area which is used by the system 300 in FIG. 3 to maximize the fidelity of the analog signal 323. The graphs introduced in FIG. 1 and FIG. 2 are essentially continuous representations of actual discrete interference signal measurements.

The routine 400 is initiated by the microcontroller 315 at step 401.

In step 403 a phase index count (i) corresponding to a phase of the signal processing clock signal 307 is set to an initial condition. For i=0 a 1st phase is chosen. During the acquisition of the interference signal model the phase index count (i) is varied to an index count I which represents the maximum phase point of the model. The model can represent the interference signal in 1° increments or any other convenient granularity, bounded between any two convenient phases.

Then, in step 405 the microcontroller 315 sets the phase of the phase programmable clock generator 305 to the 1st phase.

Next, in step 407 the microcontroller 315 commands the A/D converter 313 using signal 329 to acquire the interference signal 311 from the first input of the A/D converter 313 and receives the corresponding data 327 in digital form.

In step 409 the acquired interference signal 311 D(i) is stored in an interference signal table.

Then, in steps 411 and 413 the phase index count i is incremented and steps 407 and 409 are repeated until a complete interference signal table is acquired.

The routine 400 is exited at step 415. An example of a typical interference signal table in tabular form is shown below. In the above-described routine 400 the phase index count (i) starts at a zero degree phase offset and spans to a 359° offset to generate a complete interference signal table with 1° resolution. Alternatively, the table can have other starting and ending phase indexes and granularities.

TABLE 1

| PHASE INDEX COUNT (i) | ACQUIRED INTERFERENCE SIGNAL |
| --- | --- |
| 0 | −0.19 |
| 1 | −0.17 |
| 2 | −0.16 |
| 3 | −0.14 |
| 4 | 0.70 |
| 5 | 0.93 |
| 6 | 1.16 |

TABLE 1-continued

| PHASE INDEX COUNT (i) | ACQUIRED INTERFERENCE SIGNAL |
|---|---|
| ... | ... |
| 340 | 0.29 |
| 341 | 0.24 |
| 342 | 0.10 |
| 343 | −0.04 |
| 344 | −0.18 |
| 345 | −0.32 |
| 346 | −0.25 |
| 347 | −0.18 |
| 348 | −0.11 |
| 349 | −0.04 |
| 350 | 0.03 |
| 351 | 0.10 |
| 352 | 0.17 |
| 353 | 0.12 |
| 354 | 0.07 |
| 355 | 0.02 |
| ... | ... |
| 358 | −0.03 |
| 359 | −0.08 |

Notice in the above table that the region bounded between 343° and 355° has a relatively stable amplitude. This region will be used to correct the phase of the phase programmable clock generator 305 to reduce the effect of the interference. Selection of this most stable region is the subject of FIG. 5 and associated EQUATION 1 described next.

Figure 5:
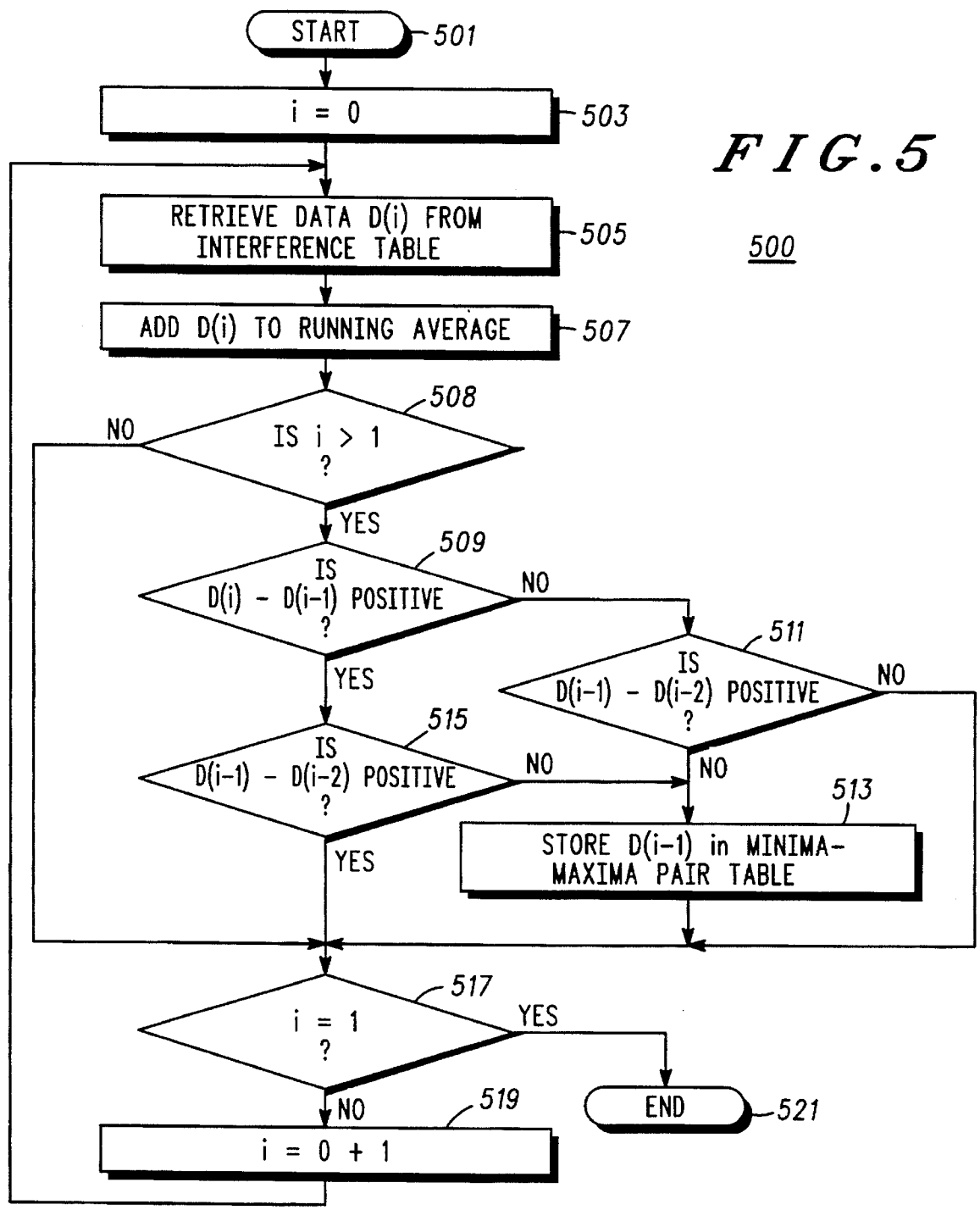
FIG. 5 is a flow chart showing a post-processing operation of generating a model of local minima-maxima pairings from the interference signal model acquired in the method steps shown in FIG. 4.

FIG. 5 is a flow chart showing a post-processing operation of generating a model of local minima-maxima pairings from the interference signal model represented in TABLE 1 and acquired in the method steps shown in FIG. 4. Essentially, the method shown in FIG. 5 parses the interference signal model and generates a new table (2) of minima-maxima pairings.

The routine 500 is initiated by the microcontroller 315 at step 501.

In step 503 a phase index count (i) corresponding to a phase of the signal processing clock signal 307 is set to an initial condition. For i=0 the 1st element in the interference signal table derived in step 409 of FIG. 4 and shown above in TABLE 1 is chosen.

Then, for step 505 the data associated with the 1st entry D(0) in the interference signal table 409 is retrieved. In step 507, the retrieved interference signal D(0) is added to a running average. This running average represents the average value of the interference signal and in an offset elimination application is used to eliminate the effect of the inherent offset corresponding to the interference signal measurement circuit, which is measured by the clock driven interference measurement circuit 309.

Step 509 determines if the signal D(i−1) is positive going by comparing it to a previous sample D(i−1). If the signal D(i) is positive going, step 515 checks whether the previous two samples D(i−1) and D(i−2) were positive going. If step 515 is false and the previous two samples D(i−1) and D(i−2) were not positive going, D(i) is stored as a minimum in step 513. If the signal of 509 is not positive going, step 511 checks whether the previous two samples D(i−1) and D(i−2) were positive going. If step 511 is true and the previous two samples D(i−1) and D(i−2) were positive going, D(i−1) is stored as a maximum in step 513.

Then, in steps 517 and 519 the phase index count (i) is incremented and steps 505, 507, 509, 511, 515, and 513 are repeated until a complete minima-maxima table is acquired.

The routine 500 is exited at step 521. An example of a typical minima-maxima table is shown below.

TABLE 2

| PHASE INDEX COUNT (i) | MINIMA (mV) | MAXIMA (mV) |
|---|---|---|
| 24 |  | 4.00 |
| 110 | −4.00 |  |
| 186 |  | 1.94 |
| ... | ... | ... |
| 345 | −0.32 |  |
| 352 |  | 0.17 |

Once TABLE 2 is constructed it can be rearranged into a maxima-minima pair table where a maxima-minima pair is defined as two adjacent entries in the maxima-minima table. An example of a typical maxima-minima pair table is illustrated in TABLE 3 below.

TABLE 3

| j | PHASE INDEX COUNT (i) | MINIMA (mV) | MAXIMA (mV) |
|---|---|---|---|
| 1 | 24 |  | 4.00 |
|  | 110 | −4.00 |  |
| 2 | 110 | −4.00 |  |
|  | 186 |  | 1.94 |
| ... | ... | ... | ... |
| 3 | 345 | −0.32 |  |
|  | 352 |  | 0.17 |

Once TABLE 3 is constructed a deterministic equation can be used to find the most stable operating area for the phase programmable clock generator 305 to minimize the effect of the interference signal on the processed analog signal 323. This requires scoring a magnitude parameter of the minima-maxima pair using the following deterministic relationship which is repeated for each minima-maxima pair in TABLE 3 to search for the most stable, or minimum deviation from the running average determined in step 507 from FIG. 5.

$$x_j = ||maxima_j - minima_j| - average| \qquad \text{EQUATION 1}$$

In the example shown here the winning minima-maxima pair is bounded between 345° and 352°. Now several possibilities exist for picking a best operating phase for the phase programmable clock generator 305 from FIG. 3. Preferably, a value centered within the interference signal model between 345° and 352° is used. So a phase correction signal 317 corresponding to either 348° or 349° will be desirable. In an operation described next, phase correction signal 317 is provided to the phase programmable clock generator 305 to maximize the fidelity by minimizing the offset in this example of the processed analog signal 323. Note that the technique to select an optimal operating phase range for the noise power interference type behavior may be different.

For example, to create the noise power interference signal 201 shown in FIG. 2 the interference measurement circuit 309 of FIG. 3 would include a control circuit similar to the analog signal processing circuit of interest as well as a precision rectifier and filter to produce an output noise power signal 311. Alternatively, the rectifier and filter functions could also be implemented in controller 315. If this approach is taken then the controller 315 could include a DSP (Digital Signal Processor) such as a Motorola MC56156. Then, as described for the offset case, a noise power interference model would be generated and an optimal operating point selected by a deterministic equation that looks for a most stable minima operating point in the noise power interference signal 201.

Figure 6:
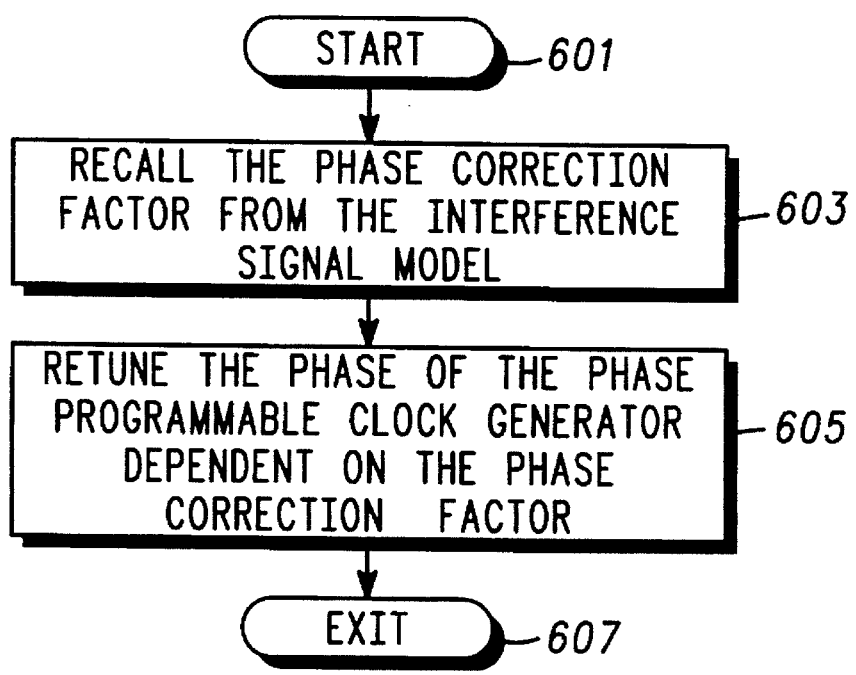
FIG. 6 is a flow chart showing a method of reducing interference in a processed analog signal.

FIG. 6 is a flow chart showing a method of reducing an interference signal's effect on the fidelity of the processed analog signal 323. The routine 600 is initiated by the microcontroller 315 at step 601 and runs continuously after the interference sign model has been acquired, parsed, processed and a preferred phase correction signal has been determined. At step 603 the phase correction factor is acquired dependent on the interference signal model.

Next, in step 605 a phase of the phase programmable clock generator is set to the derived phase correction factor (here 348°), thereby improving the fidelity of the processed analog signal 323 in this running mode.

Once a preferred phase operating point has been set for the phase programmable clock generator 305, it may become desirable to fine tune the phase adjustment to correct for variance in interference effects over time and temperature. This can be simply accomplished by continuing to monitor the interference signal 311 over time, and adjust the phase of the signal processing clock signal 307 to minimize interference effects.

In conclusion, an approach including a method and a system for improving signal fidelity in a mixed-mode analog-digital signal processing circuits has been detailed above. As demonstrated, this approach is useful for improving signal fidelity dependent on interference attributable to on-chip digital signals, either periodic or aperiodic in nature.

What is claimed is:

1. An interference dependent adaptive phase clock controller method comprising the steps of:

generating a system clock signal;

synthesizing a signal processing clock signal having a phase dependent on the system clock signal;

receiving an interference signal dependent on a phase difference between the system clock signal and the signal processing clock signal, and providing a phase correction signal dependent thereon, wherein the phase correction signal is generated by iteratively changing a phase relationship between the system clock signal and the signal processing clock signal and measuring an interference signal dependent thereon and generating an interference signal model having a multiplicity of entries;

determining an average interference signal dependent on the multiplicity of entries of the interference signal model;

determining minima-maxima pairs from the interference signal model;

determining the maxima-minima pair having the smallest deviation from the average interference signal and providing a phase correction signal dependent thereon; and adjusting the phase between the system clock signal and the signal processing clock signal dependent on the phase correction signal.

2. An interference dependent adaptive phase clock controller method comprising the steps of:

providing a system clock signal having transitions;

synthesizing a signal processing clock signal having a phase dependent on transitions of the system clock signal;

processing an analog signal dependent on the signal processing clock signal, and providing a processed analog signal including an interference component dependent thereon;

processing a control channel dependent on the signal processing clock signal, and providing an interference signal, associated with the interference component of the processed analog signal, and having a magnitude variable dependent on a phase between the system clock signal and the signal processing clock signal;

providing a phase correction signal dependent on the interference signal; and reducing the interference component of the processed analog signal by adjusting the phase between the system clock signal and the signal processing clock signal dependent on the phase correction signal.

3. A method in accordance with claim 2 wherein the step of processing the analog signal comprises a step of receiving a noise signal dependent on a phase between the system clock signal and the signal processing clock signal, and providing a processed analog signal including an interference component dependent on the received noise signal.

4. A method in accordance with claim 2 wherein the step of processing the analog signal comprises a step of receiving an offset signal dependent on a phase between the system clock signal and the signal processing clock signal, and providing a processed analog signal including an interference component dependent on the received offset signal.

5. A method in accordance with claim 2 wherein the step of providing a phase correction signal comprises the steps of:

determining magnitudes of a multiplicity of interference signals associated with a multiplicity of phases between transitions of the system clock signal and the signal processing clock signal; and providing a phase correction signal dependent on an interference signal, bounded between a plurality of interference signals of the multiplicity of interference signals, the plurality of interference signals extracted from the multiplicity of interference signals having a smallest deviation in magnitude of a remaining multiplicity of interference signals.

6. An interference dependent adaptive phase clock controller comprising:

a generator for providing a system clock signal having transitions;

a clock circuit for synthesizing a signal processing clock signal having a phase dependent on transitions of the system clock signal;

a first circuit for processing an analog signal dependent on the signal processing clock signal, and providing a processed analog signal including an interference component dependent thereon;

a second circuit for processing a control channel dependent on the signal processing clock signal, and providing an interference signal, associated with the interference component of the processed analog signal, and having a magnitude variable dependent on a phase between the system clock signal and the signal processing clock signal;

a circuit for providing a phase correction signal dependent on the interference signal; and a circuit for reducing the interference component of the processed analog signal by adjusting the phase between the system clock signal and the signal processing clock signal dependent on the phase correction signal.

7. A controller in accordance with claim 6 wherein the first circuit for processing an analog signal comprises a circuit for receiving a noise signal dependent on a phase difference between the system clock signal and the signal processing clock signal, and providing the processed analog signal, including the interference component, dependent on the received noise signal.

8. A controller in accordance with claim 6 wherein the first circuit for processing an analog signal comprises a circuit for receiving an offset signal dependent on a phase between the system clock signal and the signal processing clock signal, and providing a processed analog signal including an interference component dependent on the received offset signal.

9. A controller in accordance with claim 6 wherein the circuit for providing a phase correction signal comprises:

a circuit for determining magnitudes of a multiplicity of interference signals associated with a multiplicity of phases between transitions of the system clock signal and the signal processing clock signal; and a circuit providing a phase correction signal dependent on one of the determined magnitudes of the multiplicity of interference signals bounded between a plurality of interference signals of the multiplicity of interference signals, the plurality of interference signals extracted from the multiplicity of interference signals having a smallest deviation in magnitude of the remaining multiplicity of interference signals.

10. A controller in accordance with claim 6 wherein the generator, the clock circuit, the first circuit, the second circuit, the circuit for providing a phase correction signal, and the circuit for reducing the interference component of the processed analog signal, are all located on a single integrated circuit substrate.

11. A controller in accordance with claim 10 wherein the first circuit and the second circuit are constructed using switched-capacitor integrated circuit architecture.

* * * * *